United States Patent [19]

Imagawa et al.

[11] Patent Number: 4,839,701
[45] Date of Patent: Jun. 13, 1989

[54] HYDROGENATED AMORPHOUS SILICON FILM

[75] Inventors: Osamu Imagawa; Masazumi Iwanishi; Seiichiro Yokoyama, all of Otsu, Japan

[73] Assignee: Toyo Boseki Kabushiki Kaisha, Osaka, Japan

[21] Appl. No.: 258,118

[22] Filed: Oct. 14, 1988

Related U.S. Application Data

[63] Continuation of Ser. No. 870,035, Jun. 3, 1986.

[30] Foreign Application Priority Data

Jun. 3, 1985 [JP] Japan .................................. 60-121217

[51] Int. Cl.$^4$ .......................................... H01L 45/80
[52] U.S. Cl. .......................................... 357/2; 357/30
[58] Field of Search .......................... 357/2, 30 K, 59

[56] References Cited

U.S. PATENT DOCUMENTS 4,409,605 10/1983 Ovshinsky .............................. 357/2
4,620,085 10/1986 Wenterling ....................... 357/30 K Primary Examiner—Martin H. Edlow
Attorney, Agent, or Firm—Wegner & Bretschneider

[57] ABSTRACT

A process for production of a hydrogenated amorphous silicon film of a silicon compound containing at least one element selected from the group consisting of hydrogen and halogens and having a photosensitivity of not less than 0.1 erg/cm$^2$ at 780 nm, which comprises supplying a gas selected from the group consisting of $SiH_4$, $SiF_4$ and $Si_2H_6$ into a discharge space, and subjecting the gas to glow discharge within the discharge space having a gradient discharge intensity.

The present invention provides an a-SiH film which has a remarkable high sensitivity in a long wavelength region with maintaining a high photosensitivity in a visible light region, and has a remarkable less defect density, and the process for production of such film in a high deposition rate.

2 Claims, 3 Drawing Sheets

FIG. 3
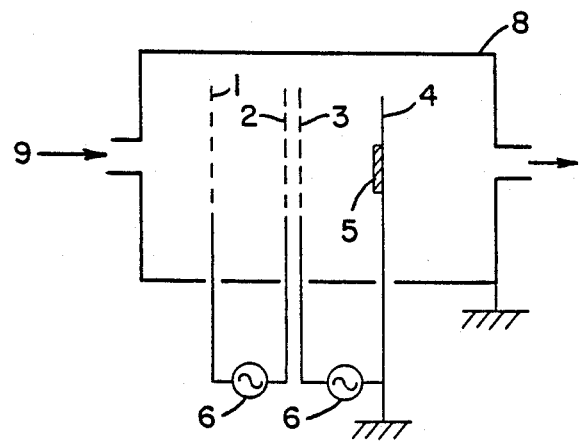
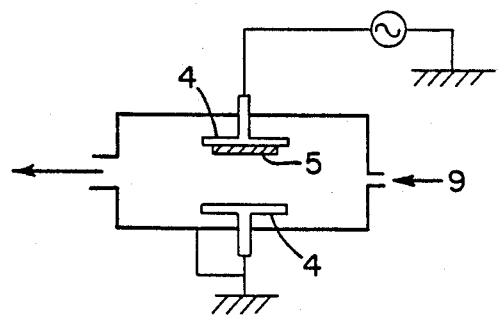
FIG. 5

HYDROGENATED AMORPHOUS SILICON FILM

This application is a continuation of U.S. application Ser. No. 870,035, filed June 3, 1986.

FIELD OF THE INVENTION

This invention relates to a hydrogenated amorphous silicon film (hereinafter, expressed as "a-SiH") which has a high photosensitivity at a long wavelength region and at a over a wide range of wavelengths without containing metals (impurity) such as germanium, tin and the like.

BACKGROUND OF THE INVENTION

Recently, an a-SiH film is in a development stage for a wide practical application such as a solar cell, an optical sensor, a field effect transistor (FET), an electrophotographic photoreceptor and etc, and is a remarkable material for electronics industry.

As methods for producing such a-SiH, there are known methods that a silicon target is sputtered in an atmosphere of active hydrogen, and that $SiH_4$ or $SiF_4$ gas is decomposed by glow discharging.

By sputtering method, there can be hardly obtained an a-SiH film having good characteristics because it is difficult to control a hydrogen content which have significant effects upon film characteristics of an a-SiH.

On the other hand, by glow discharging method, there can be obtained a film having less defects such as dangling bond, void, or the like. The glow discharging method also has a merit that control of valence electrons for n or p type a-SiH is possible, and that a film can be formed onto an appropriate shape of a substrate (i.e. a film having a wide area can be obtained). Therefore, recently, an a-SiH film having good characteristics is mainly produced by glow discharging method.

However, an a-SiH film produced by the conventional glow discharging method has an insufficient photosensitivity region, particularly at a long wavelength of longer than 700 nm. Therefore, for example, when such a film is an image pickup element, the film can not cover all regions of visible rays to pickup an image. When a film is used for a solar cell, such a film can not cover a long wavelength region of a sunlight. It induces a disadvantage that a sufficient cell efficiency can not be obtained because a light having a long wavelength region is not utilized. Further, when such a film is used for a electrophotographic photoreceptor, there are defects such as limitation of colors to be used, and the like. Moreover, when such a film is used for a photoreceptor in a semiconductor laser printer having a light source of semiconductor laser, it also has an insufficient photosensitivity for a practical use. Thus, an a-SiH film for a optical functional device has been insufficient in optical characteristics.

Then, there has been hitherto produced a silicon alloy containing metals such as germanium, tin and the like as an impurity in order to promote the absorption of a light having a low energy and to provide a photosensitivity having a long wavelength by making a band gap energy narrow. The introduction of such metals, however, makes disorder of an a-SiH structure itself and involves a defect of remarkable increase of a defect level. For example, when an a-SiH film is used as a photoreceptor, the increase of a defect level in an a-SiH film causes residual voltage to make a trouble of so called "memory, ghost image", so that it injuries a commercial value of an a-SiH film.

The above glow discharge method has a further problem to be solved, that is, for example, it has a low deposition rate or low forming rate of a film. The conventional glow discharge method only achieves 1-2 $\mu$/hr at maximum.

OBJECT OF THE INVENTION

The present inventors have intensively studied a novel glow discharge method for providing an a-SiH film with a wide region of photosensitivity without containing the other metals, or for providing it with a high photosensitivity at a long wavelength region with maintaining a high sensitivity to visible rays. As the result, it has been found that a specific apparatus and specific conditions in production, particularly distributing the grade of a plasma intensity of a glow discharging space can provide an a-SiH film having good characteristics in a high deposition rate.

An object of the present invention is to provide an a-SiH film which has a remarkable high sensitivity at a long wavelength region with maintaining a high photosensitivity in a visible light region, and has a remarkable less defect density.

Further object of the present invention is to provide a process for production of the above a-SiH film in a high deposition rate.

These and other objects and advantages of the present invention will be apparent to those skilled in the art from the following description.

SUMMARY OF THE INVENTION

The present invention provides an a-SiH film having a high photosensitivity at a long wavelength region which comprises a silicon compound containing at least one element selected from the group consisting of hydrogen and halogens, and said amorphous silicon film having a photosensitivity of not less than 0.1 $cm^2$/erg at 780 nm.

The present invention also provides a method for production of an a-SiH film of a silicon compound containing at least one element selected from the group consisting of hydrogen and halogens which comprises supplying a gas selected from the group consisting of $SiH_4$, $SiF_4$ and $Si_2H_6$ into a discharge space, and subjecting the gas to glow discharge within the discharge space having a gradient discharge intensity.

The photosensitivity herein was measured in the following method.

A sample for measurement was produced by forming a block layer (a "p type" a-SiH film for a positive charge and a "n type" a-SiH film for a negative charge) onto an aluminum substrate depositing an a-SiH film to be evaluated (a-SiH film of the present invention) onto the block layer, and further forming a protective layer over the a-SiH film. The resulting sample was treated with corona discharge treatment by a high voltage continuous current (6-8 KV) to give a surface charge onto the a-SiH sample. Then, the sample was irradiated with a monochromatic light (0.66 $\mu W/cm^2$) having a constant light energy. The surface charge produced above was disappeared by the irradiation of a monochromatic light. The photosensitivity is defined as a reciprocal of an energy amount of a light which is required for decreasing a surface charge into a half.

The a-SiH film of the present invention preferably has a remarkable less defect density as described above.

By measurement with DLTS (Deep Level Transient Spectroscopy) method, a conventional a-SiH film has a localized density of state of $1 \times 10^{16}$ to $5 \times 10^{16}$ cm$^{-3}$ eV$^{-1}$, but the a-SiH film of the present invention has a decreased defect level of $4 \times 10^{14}$ to $6 \times 10^{14}$ cm$^{-3}$ eV$^{-1}$. Such structural defect has significant effects upon not only an application of an a-SiH film but also all applications of general semiconductive materials, so that the decreasing a defect density has been a remarkable important subject in development of such materials.

Particularly, when an a-SiH film is used as an electrophotographic photoreceptor or a photoconductive layer of a photoreceptor for a laser printer, a high defect density thereof undesirably increases a residual voltage based on a carrier trap, makes a image-flow and decreases an effective copy speed.

BRIEF DESCRIPTION OF THE DRAWINGS

FIGS. 1 to 3 are schematic cross-section views of apparatus used in producing the a-SiH film of the present invention.

FIG. 5 is a schematic cross-section view of apparatus used in a conventional a-SiH film.

DETAILED DESCRIPTION OF THE INVENTION

The process for production of the a-SiH film of the present invention is illustrated by using the accompany drawings.

Figure 1:
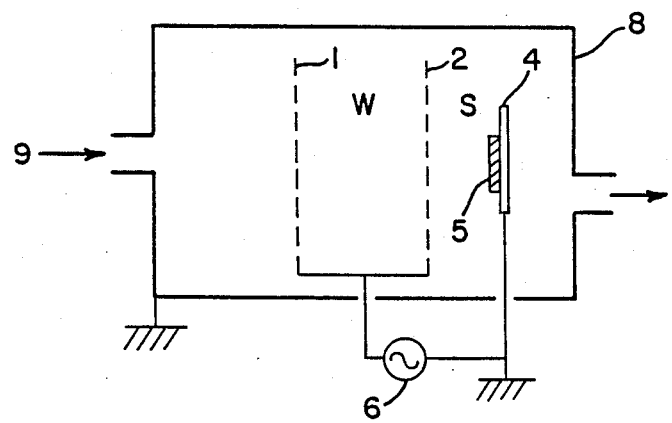

FIG. 1 shows a capacitively coupled glow discharge apparatus for forming an a-SiH film on a substrate with distributing a gradient of discharge intensity by dividing a discharge space into two parts.

After a reaction chamber 8 is degassed until about $10^{-6}$ torr, into which a silicon composition 9 (raw gas) containing at least hydrogen and halogens is charged. The raw gas 9 may be SiH$_4$, SiF$_4$, Si or the like mixed with optional dope gases such as B$_2$H$_6$, H$_2$, He, Ar or the like as a diluent gas, which controls the characteristics of a semiconductor. The raw gas 9 is passed through a discharge space to deposit it onto a substrate 5. In the discharge space, there is provided an additional electrode 2 having apertures between electrodes 1 and 4 to divide the discharge space into two parts, which are consisting of a discharge space (W) between electrodes 1 and 2, and other discharge space (S) between electrodes 2 and 4. The discharge space is divided by one RF source (high-frequency source) 6 to cause a weak discharge in the discharge space (W) and a strong discharge in the discharge space (S).

The raw gas material is exposed to steps of decomposition, excitation and diffusion thereof and reaction on the surface during passing from the weak discharge section to the strong discharge section, after which it is deposited onto the surface of the substrate.

The distribution of a discharge intensity in the process of the present invention is further illustrated. The distribution of a discharge intensity is evaluated by measuring an emission spectrum from a glow discharge plasma of a raw gas with an apparatus for optical emission spectroscopy (OES). Such OES provides a convenient means for in-process-monitoring during the growth of a film in a plasma since the intensity of an emission on each wavelength sensitively varies with discharge pressure, concentration of a raw material, RF power, flow rate of a gas, kind of a dope gas, external magnetic field. A discharge intensity during the production of a film is evaluated by measuring a plasma emission, which is conducted from each divided plasma chambers through a peephole thereof, condensed by a condenser adaptor, and conducted to a spectroscope through an optical fiber for spectrum analysis before amplification. When hydrogenated silicon such as SiH$_4$ is used as a raw material, the intensity of discharge is evaluated by the observation of an emission intensity of SiH having a wavelength of 414 nm, which is a most significant emission species for a rate of the production of a film and the characteristics of a film. When halogenated silicon such as SiF$_4$ is used as a raw material, the intensity of discharge is evaluated by the observation of an emission intensity of SiF having a most significant emission species of 440 nm. Thus, a proper discharge intensity can be set up according to desired physical properties of a film.

In FIG. 1, it is essential to use electrodes having air-permeable apertures as electrodes 1 and/or 2. There is preferably used, for example, various kinds of meshes, a punching metal or the like. The size of the air-permeable aperture in the electrode has a remarkably significant effects upon the number of defects and a photosensitivity of the film.

That is, there is a suitable range of a size for producing an a-SiH film having a photosensitivity of over 0.1 cm$^2$/erg at a long wavelength region, for example, at 780 nm while maintaining a less defect number and a high sensitivity to a visible light region.

In case of a wire netting, it has preferably an aperture size of 0.5 to 100 mesh, more preferably 1 to 30 mesh. When the aperture size is over 100 mesh, it maintains a relative high photosensitivity, but it undesirably causes some decrease of a photosensitivity at a long wavelength region. On the other hand, when smaller than 0.5 mesh, it maintains a relative high photosensitivity at a long wavelength region, but it undesirably induces a decrease of sensitivity to a visible light region. The mesh indicating a size of an aperture of a wire netting is herein defined as follows for convenience. That is, "mesh" indicates the number of holes per one inch length. Then, when a size of a hole is 1 inch, an electrode is designated an electrode having an aperture size of 1 mesh. When a size of a hole is 2 inches, an electrode is designated an electrode having an aperture size of 0.5 mesh.

As to the conditions for production, the temperature of a substrate also have significant effects upon the photosensitivity. Although the photosensitivity relatively increase at a long wavelength with increasing the temperature of the substrate, a charging ability of a photoconductive layer is decreased. Therefore, when the film is used as a photoconductive layer for a electrophotographic photoreceptor or a photoreceptor in a laser printer, the temperature of the substrate is preferably not more than 350° C. Although, the temperature of the substrate which produces the minimum defect density is varied depending on the size of the aperture of the electrodes which divide the discharge space, the temperature is preferably from 230°–315° C. when the electrode has an aperture size of 1–100 mesh.

The present invention has an essential feature that a plasma space is divided into a multistage for the production of an a-SiH film in glow discharge method.

Although FIG. 1 shows a discharge space divided into two spaces, the discharge space used in the present invention may be divided into any numbers of spaces provided that it gives the gradient of a plasma intensity, and the number of division is not limited. Such division is carrie out by appropriately using RF and/or DC source as a power source.

Figure 2:
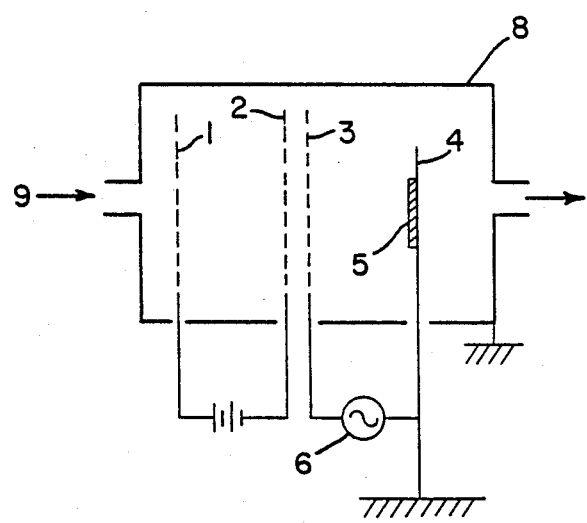

FIG. 2 shows a further embodiment of the present invention wherein the a-SiH film is formed by inducing DC discharge between electrodes 1 and 2, and RF discharge between electrodes 3 and 4. The space between the electrodes 1 and 2 is provided with a weak discharge intensity (W), and the space between electrodes 3 and 4 is provided with a strong discharge intensity.

FIG. 3 shows an other embodiment of the present invention wherein the discharge space is divided with two RF power sources. The space between the electrodes 1 and 2 is provided with a weak discharge intensity (W), and the space between electrodes 3 and 4 is provided with a strong discharge (S).

Either apparatus of FIG. 2 or FIG. 3 can produce the a-SiH film of the present invention. Although it is not unclear why the method can produces the a-SiH film having a wide photosensitivity region, there can be clearly found out that such method results in a smaller optical band gap energy (Eg opt) rather than that of a conventional a-SiH. A conventional a-SiH film usually has a Eg opt of about 1.7 eV. On the other hand, under an appropriate condition, the present invention can provide the a-SiH film which has a narrow Eg opt of about 1.58 to 1.61 eV as a sole a-iH film. It seems that the absorption of a low energy light or a light having a long wave length region based on the above narrow Eg opt causes the increased photosensitivity having a long wavelength.

Advantages of the Invention

The a-SiH film of the present invention, which differs from a conventional a-SiH film, has a higher photosensitivity at a long wavelength region or at 780 nm without containing metal impurity such as germanium, tin etc, so that it can be preferably used for a photoconductive material of an electrophotographic photoreceptor as well as a photoreceptor of a semiconductor laser.

The present invention is further illustrated by the following Examples, but not intended to limit thereto.

EXAMPLE 1

Referring FIG. 1, either electrode 1 or 2 had a size of apertures of 10 mesh, and they were disposed at a distance of 25 mm apart from each other. An electrode 4 was disposed at a distance of 25 mm apart from electrode 2. On electrode 4, a polished Al plate was disposed. There were caused a weak discharge section between electrodes 1 and 2, and a strong discharge section between the electrodes 2 and 4 with applying an electric power of 200 W by RF power source 6 (13.56 MHz) at a substrate temperature of 240° C.

The samples of a photoreceptor having three layers, which were used for evaluation, were obtained with the above apparatus under the conditions shown in Table 1. That is, the sample had a blocking layer, a photoconductive layer and a surface layer on Al plate in order. In such production of the film, there was obtained a deposition rate of a photoconductive layer of 25 $\mu$/hr. Using the resultant samples of the photoreceptor having three layers, a saturation charge ability and a spectral response at a wavelength of 400–800 nm and a light intensity of 0.66 $\mu$W/cm$^2$ were measured. The results are shown in Table 2 and FIG. 4. Using the sample obtained from the same method described above, a localized density of state in an energy gap of the sample was measured by DLTS method. The result is shown in Table 2.

EXAMPLE 2

Figure 4:
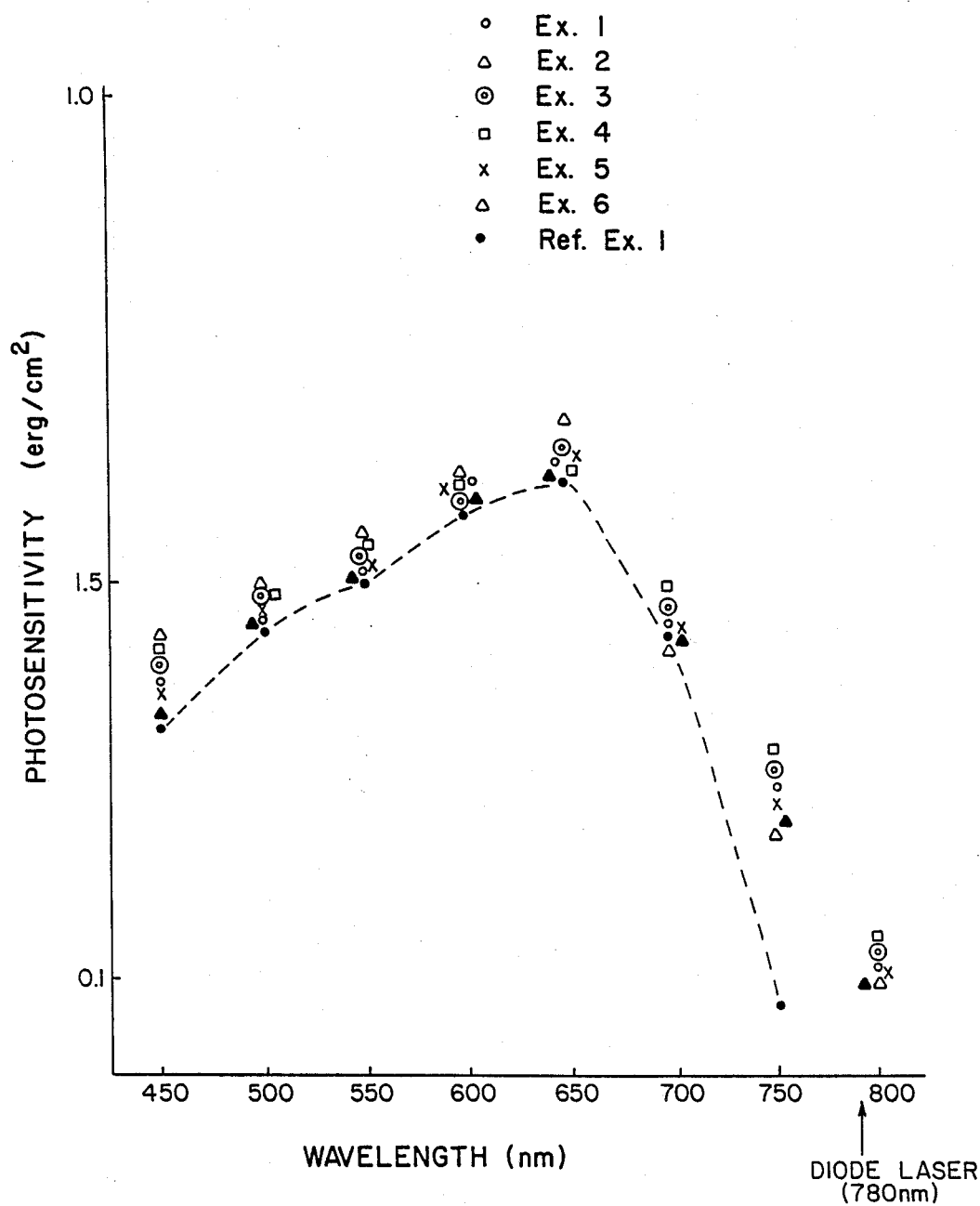
FIG. 4 is a graph showing spectral response characteristics of a-SiH film (photoconductive layers).

A sample having three layers was obtained in the same manner as described in Example 1 shown in Table 1 except for using of metal netting electrodes of 50 mesh (see Table 1). The deposition rate of a photoconductive layer was 23 $\mu$/hr. The resultant sample was used for the measurement of a spectral response, a saturation charge acceptance and a localized density of state. The results are shown in FIG. 4 and Table 2.

EXAMPLE 3

A sample having three layers was obtained in the same manner as described in Example 1 shown in Table 1 except for using of a substrate temperature of 320° C. The deposition rate of a photoconductive layer was 20 $\mu$/hr. The resultant sample was used for the measurement of a spectral response, a saturation discharge ability and a localized density of state. The results are shown in FIG. 4 and Table 2.

EXAMPLE 4

An a-SiH film was obtained with the apparatus shown in FIG. 3, wherein the discharge space was divided by two high-frequency power sources 6. Referring FIG. 3, either electrode 1, 2 or 3 was a metal netting electrode having a size of apertures of 10 mesh. The distance between electrodes 1 and 2 was 25 mm, the distance between electrodes 3 and 4 was also 25 mm, and the distance between electrodes 2 and 3 was 3 mm. The temperature of a substrate 5 was 270° C. The sample having three layers was obtained by applying an electric power of 20 W between electrodes 1 and 2, and an electric power of 200 W between electrodes 3 and 4, with using a raw gas having a composition shown in Table 1. The deposition rate of a photoconductive layer was 21 $\mu$/hr.

The resultant sample was used for the measurement of a spectral response, a saturation discharge ability and a localized density of state. The results are shown in FIG. 4 and Table 2.

EXAMPLE 5

Using SiF$_4$ gas as a raw material for an a-SiH film a photoreceptor sample having three layers was obtained in a same manner as described in Example 4. The deposition rate of a photoconductive layer was 28 $\mu$/hr. The characteristics of the resultant film were evaluated. The results are shown in FIG. 4 and Table 2.

EXAMPLE 6

As shown in FIG. 2, an a-SiH film was formed with an apparatus having the divided discharge spaces which consists of a space defined by electrodes 1 and 2 with DC power source and a space defined by electrodes 3 and 4 with RF power source 6. Either electrode 1, 2 or 3 was a metal netting electrode having a size of apertures of 5 mesh. The temperature of a substrate 5 was 300° C. Either distance between electrodes 1 and 2 or electrodes 3 and 4 was 25 mm, and the distance between electrodes 2 and 3 was 3 mm. The sample of a photoreceptor having three layers was obtained by applying an electric power of 15 W between electrodes 1 and 2, and an electric power of 300 W between electrodes 3 and 4, with using a raw gas having a composition shown in Table 1. The deposition rate of a photoconductive layer was 22 μ/hr.

The characteristics of the resultant sample were evaluated. The results are shown in FIG. 4 and Table 2.

REFERENCE EXAMPLE 1

An a-SiH film was obtained with a conventional glow discharge apparatus having parallel round plate type electrodes without divided discharge spaces shown in FIG. 5. Each round electrodes had a diameter of 10 cm, and was disposed at a distance of 4 cm apart from each other. The temperature of a substrate was 250° C. The sample having three layers was obtained by applying high-frequency voltage of 13.56 MHz under an electric power of 15 W onto the electrodes, with using a raw gas having a composition shown in Table 1. The deposition rate of a photoconductive layer was 3.5 μ/hr. The characteristics of the resultant film were evaluated. The results are shown in FIG. 4 and Table 2.

TABLE 2

|  | Saturation Charge Acceptance[2] (V/μm) | Localized Density of State ($cm^{-3} eV^{-1}$) |
| --- | --- | --- |
| Ex. 1 | 29 | $3 \times 10^{15}$ |
| 2 | 24 | $2 \times 10^{15}$ |
| 3 | 13 | $5 \times 10^{14}$ |
| 4 | 22 | $1 \times 10^{15}$ |
| 5 | 21 | $4 \times 10^{14}$ |
| 6 | 17 | $6 \times 10^{14}$ |
| Ref. Ex. 1 | 20 | $3 \times 10^{16}$ |

[2]Saturation charge acceptance:

An a-SiH sample was treated with corona discharge treatment under a high voltage of 6.5 KV to give the sample a surface charge. The discharge treatment was repeated to saturate the amount of the surface charge, which was measured with a surface electrometer.

What is claimed is:

1. A hydrogenated amorphous silicon film having high photosensitivity at a long wavelength range of greater than 700 nm which consists essentially of a compound of silicon and hydrogen,
    said amorphous film having a photosensitivity of not less than 0.1 $cm^2$/erg at 780 nm.

2. A hydrogenated amorphous silicon film according to claim 1, which has a localized density of state of not more than $3 \times 10^{15}$ $cm^3$.eV.

* * * * *

TABLE 1

|  |  | Blocking Layer |  | Photoconductive[1] Layer |  | Surface Layer |  |
| --- | --- | --- | --- | --- | --- | --- | --- |
| Ex. 1 | $SiH_4$ $B_2H_6/H_2$ | (5000 ppm) | 200 cc/min 20 | $SiH_4$ | 200 cc/min | $SiH_4$ $N_2$ | 200 cc/min 60 |
| 2 | $SiH_4$ $B_2H_6/H_2$ | (5000 ppm) | 200 cc/min 20 | $SiH_4$ | 200 cc/min | $SiH_4$ $N_2$ | 200 cc/min 60 |
| 3 | $SiH_4$ $B_2H_6/H_2$ | (5000 ppm) | 200 cc/min 20 | $SiH_4$ | 200 cc/min | $SiH_4$ $N_2$ | 200 cc/min 60 |
| 4 | $SiH_4$ $B_2H_6/H_2$ | (5000 ppm) | 300 cc/min 30 | $SiH_4$ | 300 cc/min | $SiH_4$ $N_2$ | 300 cc/min 90 |
| 5 | $SiF_4$ $B_2H_6/H_2$ | (5000 ppm) | 150 cc/min 15 | $SiF_4$ | 150 cc/min | $SiH_4$ $N_2$ | 150 cc/min 45 |
| 6 | $SiH_4$ $B_2H_6/H_2$ | (5000 ppm) | 150 cc/min 15 | $SiH_4$ | 150 cc/min | $SiH_4$ $N_2$ | 150 cc/min 45 |
| Ref. Ex. 1 | $SiH_4$ $B_2H_6/H_2$ | (5000 ppm) | 20 cc/min 2 | $SiH_4$ | 20 cc/min | $SiH_4$ $N_2$ | 20 cc/min 6 |

[1]Photoconductive layer corresponds to the a-SiH film of the present invention.